United States Patent [19]

Bächle et al.

[11] 4,163,159
[45] Jul. 31, 1979

[54] ATTENUATION-FREE ELECTRONIC SWITCH

[75] Inventors: Erich Bächle, Ulm; Rudolf Schehrer, Geislingen; Dietrich Höppner, Blaustein-Wippingen, all of Fed. Rep. of Germany

[73] Assignee: Licentia Patent-Verwaltungs G.m.b.H., Frankfurt, Fed. Rep. of Germany

[21] Appl. No.: 862,826

[22] Filed: Dec. 16, 1977

[30] Foreign Application Priority Data

Dec. 18, 1976 [DE] Fed. Rep. of Germany ....... 2657589

[51] Int. Cl.$^2$ ............................................. H03K 17/00
[52] U.S. Cl. ..................................... 307/255; 307/241; 179/18 GF
[58] Field of Search ................. 179/186 F; 307/255, 307/322, 241

[56] References Cited

U.S. PATENT DOCUMENTS 3,931,475  1/1976  Bachle et al. .......................... 307/241

*Primary Examiner*—Larry N. Anagnos
*Assistant Examiner*—B. P. Davis
*Attorney, Agent, or Firm*—Spencer & Kaye

[57] ABSTRACT

Electronic switch for use as a crosspoint in switching networks of space-division telephone exchanges where it is connected to function as an open circuit stable negative resistance provding ON-attenuation compensated signal transmission, the switch being constituted by a circuit arrangement which lends itself to monolithic integration and which, when switched off, prevents undersirable attenuation of crosspoints connected to the same row or column of the switching system.

4 Claims, 3 Drawing Figures

ATTENUATION-FREE ELECTRONIC SWITCH

BACKGROUND OF THE INVENTION

The present invention relates to an attenuation-free electronic switch, particularly for use as a semiconductor crosspoint in switching networks utilized in space-division telephone exchanges, the switch being of the type which includes semiconductors arranged in series to the line to be switched to serve as switching elements which are connected as an open circuit stable negative resistance so that in the ON-state, the elements permit signals to pass in both transmission directions without ON-attenuation.

Attenuation-free electronic switches are disclosed, for example, in German Auslegeschrift (Published Patent Application) No. 2,156,166, and its counterpart, British Pat. No. 1,409,895. Compensation of ON-attenuation is there effected by a controllable semiconductor combination consisting primarily of transistors and acting as a switch which, in its ON-state, has a given negative resistance value and forms a variable open circuit stable negative resistance, as disclosed in FIGS. 6 and 7 and described on page 2 and page 3, column 1 of British Pat. No. 1,409,895.

When this switch is used as a crosspoint in the switching network of a space-division telephone exchange, difficulties arise with respect to ON- an OFF-attenuation because a plurality of crosspoints of this type are connected to one column of a crosspoint array in the switching network. If the control transistor disposed in the shunt-branch switches on the associated crosspoint while the other crosspoints connected to the same column are in the OFF-state by their conductive and saturated control transistors, the crosspoint in the ON-state is attenuated additionally by the crosspoints in the OFF-state connected to the same column line.

The solution proposed in British Pat. No. 1,409,895 can be dependably realized only in a circuit constructed according to the hybrid technique. Construction according to monolithic integration techniques will result in considerable fluctuations in the circuit parameters. In particular, the additional attenuation will be fully evident in the crosspoint array.

SUMMARY OF THE INVENTION

It is an object of the present invention to eliminate the above-noted drawbacks ot the state of the art.

A more specific object of the invention is to provide an attenuation-free electronic switch of the above-mentioned type which can be monolithic integrated while narrow manufacturing tolerances are maintained, and which, when used as a crosspoint in switching networks of telephone exchanges and when in the OFF-state, prevents undesirable additional attenuation of crosspoints connected to the same column and of crosspoints connected to the same row.

These and other objects are achieved, according to the invention, in an electronic switch defining a signal transmission path extending between two terminals each arranged to be connected at a respective point in a circuit, the switch being switchable between an OFF-state in which it presents a high impedance between the terminals and an ON-state, and the switch including components defining an open circuit stable negative resistance such that in the ON-state signals are permitted to pass in both directions along the transmission path and provide attentuation compensation for such signals, by constituting the negative resistance by a first transistor of a first conductivity type and a second transistor of the opposite conductivity type having its base connected directly to the collector of the first transistor, a first resistor connected between the emitter and base of the second transistor, a second resistor connected between the base of the first transistor and the emitter of the second transistor with the point of connection between the resistor and the emitter of said second transistor constituting one terminal of said switch, a third transistor of the first conductivity type having its base connected to the collector of the second transistor and having its collector connected to the emitter of the second transistor, a third resistor connected between the base of the first transistor and the emitter of the third transistor, a fourth resistor having one end directly connected to that end of the third resistor which is connected to the emitter of the third transistor, and a diode connected between the other end of the fourth resistor and the emitter of the first transistor and poled to operate in its forward conduction direction when the collector-emitter path of the first transistor is conductive, and by further constituting the switch by a control transistor of the first conductivity type having its collector connected to the other end of the fourth resistor and whose emitter constitutes the other terminal of the switch, and switching control means connected to the base of the control transistor for supplying thereto a control signal which determines the ON-state of the control transistor and thus the switching state of the switch.

Thus, the switch according to the invention is constituted by a series connection of a control transistor and the open circuit stable negative resistance. In the blocked, or, OFF-state of the switch, the control transistor is nonconductive and produces the required OFF-attenuation. In the conductive state of the control transistor, the switch is ON and the open circuit stable negative resistance produces a compensation of a substantial portion of the transmission losses which cause insertion losses.

By the provision of a diode in the emitter input lead of the first transistor in the open circuit stable negative resistance and by providing a purely ohmic voltage divider for establishing the base bias for the first transistor, it becomes possible, in contradistinction to the prior art, to pass relatively large amplitude signals practically without distortion.

The switch according to the invention can be made in monolithic integrated form without difficulty and can be used as a crosspoint in switching networks of space-division telephone exchanges. If an adjustable resistor is connected in series with the negative resistance, the resistance value of the open circuit stable negative resistance can be adapted to the requirements of the particular system.

DESCRIPTION OF THE PREFERRED EMBODIMENTS

Figure 1:
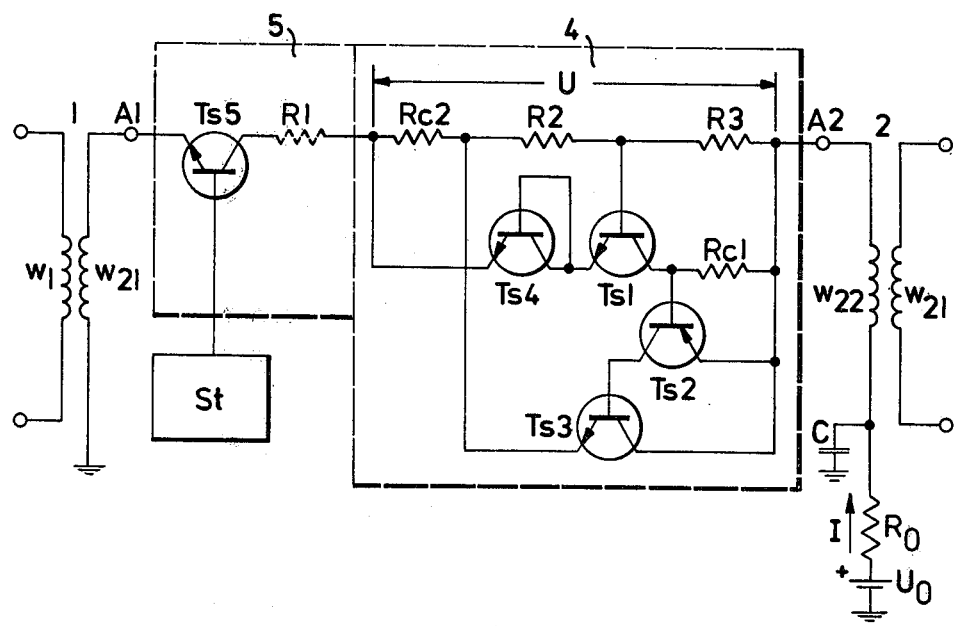
FIG. 1 is a circuit diagram of a preferred embodiment of an attenuation-free electronic switch according to the invention.

FIG. 1 shows a preferred embodiment of the attenuation free electronic switch according to the invention. The signals to be transmitted, which can be information signals and/or control signals, are transmitted from a transformer 1 to one terminal A1 of the switch and from the other terminal A2 of the switch to a second transformer 2. The switch is switched on or off by acting on the conductive state of a control transistor Ts5. Interfering transmission losses attributable to the coil resistances of transformers 1 and/or 2 are compensated to the desired degree by the circuit arrangement 4 which constitutes an open circuit stable negative resistance.

In order to supply the switch with operating voltage, that end of secondary winding $w_{22}$ of transformer 2 which is not connected to the switch is connected to the positive pole of a voltage source $U_o$ via a resistor $R_o$. Alternating voltage components are conducted directly to ground via a capacitor C. The negative pole of the voltage source $U_o$ is connected to that end of the secondary winding $w_{21}$ of transformer 1 which is not connected to the switch. In the illustrated embodiment this connection is via ground.

Resistor $R_o$, in conjunction with the voltage source $U_o$, provides the desired substantially constant current for operating the switch when the switch is switched on.

The open circuit stable negative resistance 4 includes a combination of a first NPN transistor Ts1 and a PNP transistor Ts2 whose base is connected directly with the collector of the NPN transistor Ts1 and whose emitter and base are connected together via a first resistor Rc1. The base of the NPN transistor Ts1 is connected with the emitter of the PNP transistor Ts2 via a second resistor R3. The point of connection of the first resistor Rc1 with the second resistor R3 and with the emitter of transistor Ts2 constitutes the other terminal A2 of the switch.

Furthermore, the base of a second NPN transistor Ts3 is connected to the collector of the PNP transistor Ts2. The collector of transistor Ts3 is connected with the emitter of the PNP transistor Ts2 and thus also with one end of the resistors Rc1 and R3 and with the other terminal A2 of the switch.

The emitter of the second NPN transistor Ts3 is connected to the connecting point between third and fourth resistors R2 and Rc2. Resistor R2 has its other end connected to the base of NPN transistor Ts1 and thus also to one end of resistor R3. The fourth resistor Rc2 has its other end connected, via a diode which in the illustrated embodiment is a transistor Ts4 connected as a diode, with the emitter of the first NPN transistor Ts1. The point of connection of the fourth resistor Rc2 with the transistor-diode Ts4 forms one of the terminals of the open circuit stable negative resistance 4 and the other terminal A2 of the switch forms the other terminal of the open circuit stable negative resistance. The one terminal of the negative resistance is also connected to the emitter-collector path of a third NPN transistor, the already mentioned control transistor Ts5, to whose base the control line of a control unit St is connected. The emitter of transistor Ts5 forms the one terminal A1 of the switch.

In the illustrated embodiment a resistor R1, which is shown in broken lines, is connected in series between transistor Ts5 and the open circuit stable negative resistance 4. It is of no significance for the functioning of this resistor whether it is connected in front of or behind the open circuit stable negative resistance or to the emitter, rather than the collector, of transistor Ts5. In an advantageous manner, resistor R1 is disposed in front of or behind the open circuit stable negative resistance since at this point it has no influence on the required control voltage for transistor Ts5.

Resistor R1 serves the purpose of adjusting the characteristic of the open circuit stable negative resistance 4 to the desired value. It can therefore be constituted by an adjustable resistor. If the switch is always used for the same purpose, i.e., in systems having identical operating characteristics, the components of the open circuit stable negative resistance are advisably dimensioned in such a way that resistor R1 can be eliminated.

The polarity of the diode in the emitter input lead of the transistor Ts1 should be selected so that when the emitter-collector path of transistor Ts1 is conductive, the diode is operated in its forward direction.

The open circuit stable negative resistance together with the controllable transistor Ts5 can easily be monolithic integrated, in which case transistor Ts2 is advisably fabricated as a lateral transistor as is disclosed, for example, in German Offenlegungsschrift (Laid-open Application) No. 2,555,047, and counterpart, commonly owned, U.S. Application Ser. No. 747,222 filed Dec. 3, 1976, by E. Bächle and Dr. H. Clauss. For monolithic integration it is of advantage to design the diode, as shown in FIG. 1, as an NPN transistor Ts4 whose base and collector terminals are connected directly together, i.e. short-circuited.

Figure 2:
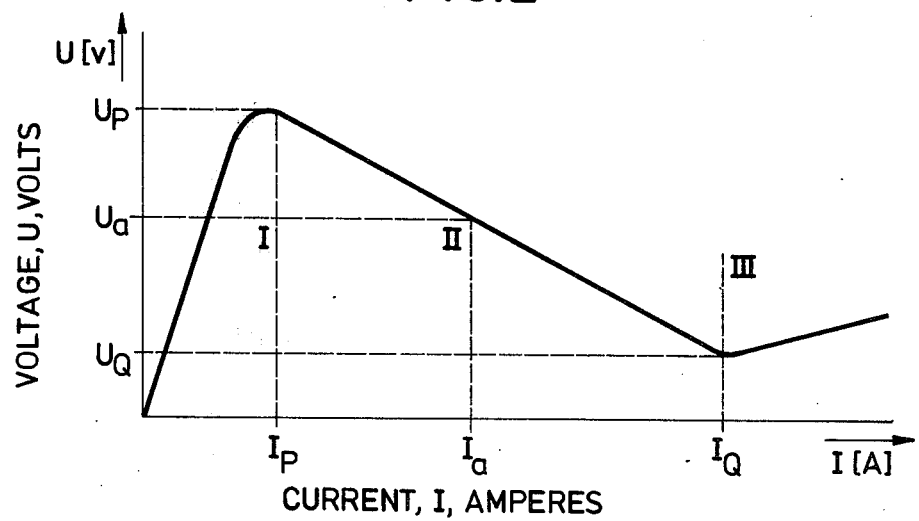
FIG. 2 is a diagram showing the voltage-current characteristic of the negative resistance circuit of FIG. 1.

The open circuit stable negative resistance 4 without resistor R1 has a current-voltage characteristic as shown in FIG. 2. In FIG. 2 the operating current I is plotted on the abscissa and the voltage U across the negative resistance is plotted on the ordinate. As can be seen, with increasing operating current, the voltage across the negative resistance increases and reaches a maximum at the voltage value $U_P$ for a current $I_P$.

With further increase in the operating current, the voltage across the negative resistance decreases and reaches its minimum $U_Q$ at an operating current $I_Q$. With a still further increase in the operating current, the voltage across the negative resistance increases again. There thus exist three current regions, i.e. the region I between current levels of O and $I_P$, the region II between current levels $I_P$ and $I_Q$ and the region III for currents greater than $I_Q$. The negative resistance range lies in region II.

The negative resistance is set to a direct current operating point Ua, Ia in region II and is then driven at this operating point with an alternating voltage. The characteristic shows that this is a current controlled, i.e. an open circuit stable negative resistance. By suitable selection of the external resistance, the negative resistance characteristic can be adjusted within wide limits.

By connecting together the open circuit stable negative resistance 4 with the control transistor Ts5, and possibly with resistor R1, one thus obtains the attenuation-free switch or the attenuation compensated switch, respectively, according to the invention.

FIG. 1 also illustrates, in simplified form, the use of the attenuation-free switch according to the invention as a crosspoint in a space-division telephone exchange. The signals to be transmitted from a first user are fed in via transformer 1 and are coupled out to the second user by transformer 2. Since the attenuation-free switch according to the invention is transmissive in both directions with the same transmission characteristics, the signals can also be transmitted in the reverse direction from user 2 to user 1.

If the conductive state of control transistor Ts5 is regulated by signals from control unit St, which is to be effected in a manner which provides as high an AC-resistance as possible in order to increase the shunt-attenuation of the attenuation-free switch, transistors Ts1 to Ts3 are set for a current determined by resistor $R_o$ and supply voltage $U_o$. As a result of the current through resistor $R_o$, the circuit arrangement 4 operates in its negative resistance region, which is counteracted by the ON-resistance of transistor Ts5, the coil resistance of the secondary windings $w_{21}$ and $w_{22}$ of transformers 1 and 2, respectively, as well as possibly the resistance of resistor R1.

If transistor Ts5 is blocked by the signal from control unit St, the switch assumes its open or OFF-state, and its OFF-attenuation is determined only by the OFF-attenuation of transistor Ts5. In order to obtain as high an OFF-attenuation as possible, transistor Ts5 must block with a low AC-resistance connected to its base (resistance less than 1 k$\Omega$).

For reasons of stability, attenuation compensation provided by the negative resistance 4 can be selected to only compensate for the winding resistance of the transformer coils $w_{21}$ and $w_{22}$, resistance R1 and the ON-resistance of the transistor Ts5. If one selects $$R1 + R_{w21} + R_{w22} - R4 = 0$$

where R4 is the amount of negative resistance, there remains the ON-resistance of transistor Ts5 as the advisable stability assurance.

Figure 3:
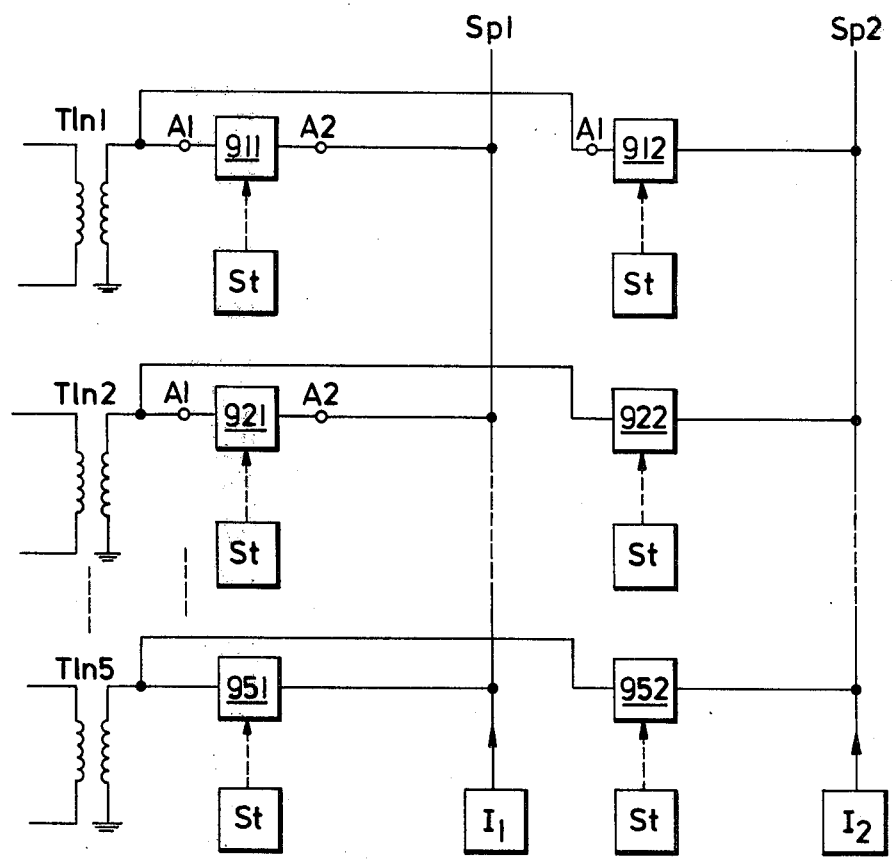
FIG. 3 is a block circuit diagram of a single stage switching network incorporating switches according to the invention.

FIG. 3 shows an example for the advantageous use of the switch according to the invention as a crosspoint in crosspoint array of a single-stage switching arrangement.

Such a crosspoint array includes, for example, 5×2 monolithic integrated switches 911, 912, 921, 922 . . . 951, 952, which are used as crosspoints and which each consist of the interconnection of an open circuit stable negative resistance 4 and a control transistor Ts5. The users Tln i (i=1, . . . 5) are each connected, via transformers, with the terminals A1 of an associated row of the switches according to the invention. In the illustrated embodiment, two switches which are arranged in the same row and are used as crosspoints are connected to each user transformer. Terminals A2 of the switches are connected, as shown in FIG. 3, to two column lines Sp1 and Sp2. Two users can thus be connected together via two respective switches in a given column and the associated column line.

In an advantageous manner the negative resistance of any one switch 9ik (i=1, 2, 3, 4, 5; k=1, 2) is dimensioned so that it compensates for the secondary winding resistance of only one user transformer. Since two switches and two transformers participate in a connection, the insertion loss between two user lines in the switching network is thus reduced to the remaining but slight ON-resistance of the control transistors Ts5 employed in the switches and to the ohmic resistances of the primary windings of the transformers.

With a given residual atenuation for the transformers, use of the attenuation-free switch according to the invention permits reduction of the transformer volume to about half. This significantly reduces the costs and space requirement for the switching network.

In order to set the operating point of the attenuation free switches, current sources $I_1$ and $I_2$ are connected to the two column lines Sp1 and Sp2. The ends of the user transformer windings which are not connected to the terminals A1 of the switches are at ground potential in this embodiment. The current can of course also be supplied in some other way. The only important thing is that a direct current of given magnitude flows through the switch, when the associated crosspoint is switched on, in the respective direction shown in FIG. 3.

For a switch used as a semiconductor crosspoint with monolithic integration the following resistance values can advisably be employed, for example, for the negative resistance 4:

$$R1 \approx 25\Omega \quad R2 \approx R3 \approx Rc1 \approx 1 \, k\Omega, \quad Rc2 \approx 50\Omega.$$

A semiconductor crosspoint monolithic integrated with these resistance values has the following characteristics:

With transistor Ts5 blocked (in the OFF-state), the OFF-attenuation is >120 dB (with reference to 600$\Omega$ (terminating resistor) at a frequency f=4 kHz).

With transistor Ts5 switched on and a base current $I_B$=1mA controlling that transistor, the negative resistance has been determined to have a negative ON-resistance of 12$\Omega$ which corresponds to a negative ON-attenuation, i.e. an amplification, of 0.09 dB, if an operating current of 5 mA is applied for the crosspoint.

The harmonic ratio of the switch for the individual harmonics is greater than 50 dB (with an alternating current drive of $\leq$2 dBm (dB referenced to 1 mWatt) and a measuring frequency of f$\leq$10 kHz).

It will be understood that the above description of the present invention is susceptible to various modifications, changes and adaptations and the same are intended to be comprehended within the meaning and the range of equivalents of the appended claims.

What is claimed is:

1. In an electronic switch defining a signal transmission path extending between two terminals each arranged to be connected at a respective point in a circuit, the switch being switchable between an OFF-state in which it presents a high impedance between the terminals and an ON-state, and the switch including components defining an open circuit stable negative resistance such that in the an ON-state signals are permitted to pass in both directions along the transmission path and provide attenuation compensation for such signals, the improvement wherein said negative resistance comprises:

a first transistor of a first conductivity type and a second transistor of the opposite conductivity type having its base connected directly to the collector of said first transistor;

a first resistor connected between the emitter and base of said second transistor;

a second resistor connected between the base of said first transistor and the emitter of said second transistor, with the point of connection between said resistors and the emitter of said second transistor constituting one terminal of said switch;

a third transistor of the first conductivity type having its base connected to the collector of said second transistor and having its collector connected to the emitter of said second transistor;

a third resistor connected between the base of said first transistor and the emitter of said third transistor;

a fourth resistor having one end directly connected to that end of said third resistor which is connected to the emitter of said third transistor; and a diode connected between the other end of said fourth resistor and the emitter of said first transistor and poled to operate in its forward conduction direction when the collector-emitter path of said first transistor is conductive, and said switch further comprises a control transistor of the first conductivity type having its collector connected to the other end of said fourth resistor and whose emitter constitutes the other terminal of said switch, and switching control means connected to the base of said control transistor for supplying thereto a control signal which determines the conductive state of said control transistor and thus the switching state of said switch.

2. An arrangement as defined in claim 1 wherein the first conductivity type is NPN and the opposite conductivity type is PNP.

3. An arrangement as defined in claim 1 further comprising an adjustable resistor connected in series with said negative impedance.

4. A switching apparatus in space-division telephone exchanges comprising the switch defined in claim 1 connected to constitute a crosspoint of said apparatus.

* * * * *